(12) United States Patent
Hadas et al.

(10) Patent No.: US 12,050,525 B2
(45) Date of Patent: Jul. 30, 2024

(54) SIMULATING CONTAINERIZED CLUSTERS

(71) Applicant: RED HAT, INC., Raleigh, NC (US)

(72) Inventors: Arik Hadas, Herzliya (IL); Daniel Erez, Raanana (IL)

(73) Assignee: Red Hat, Inc., Raleigh, NC (US)

(*) Notice: Subject to any disclaimer, the term of this patent is extended or adjusted under 35 U.S.C. 154(b) by 435 days.

(21) Appl. No.: 17/006,691

(22) Filed: Aug. 28, 2020

(65) Prior Publication Data

US 2022/0066904 A1     Mar. 3, 2022

(51) Int. Cl.
G06F 11/34 (2006.01)
G06F 9/50 (2006.01)
G06F 30/20 (2020.01)

(52) U.S. Cl.
CPC ........ *G06F 11/3457* (2013.01); *G06F 9/5077* (2013.01); *G06F 30/20* (2020.01); *G06F 2201/86* (2013.01); *G06F 2209/505* (2013.01)

(58) Field of Classification Search
CPC .... G06F 11/3457; G06F 9/5077; G06F 30/20; G06F 2201/86; G06F 2209/505; G06F 9/45; G06F 2201/815
See application file for complete search history.

(56) References Cited

U.S. PATENT DOCUMENTS

| | | | |
|---|---|---|---|
| 8,738,333 B1 * | 5/2014 | Behera | G06F 9/5061 703/2 |
| 9,223,634 B2 | 12/2015 | Chang et al. | |
| 10,263,853 B2 | 4/2019 | Poort et al. | |
| 10,379,883 B2 | 8/2019 | He et al. | |
| 11,087,042 B1 * | 8/2021 | Hussey | G06F 8/63 |
| 2012/0166164 A1 * | 6/2012 | Reusch | G06Q 10/04 703/6 |

(Continued)

FOREIGN PATENT DOCUMENTS

| CN | 110769063 A | 2/2020 |
|---|---|---|
| WO | 2013028211 A1 | 2/2013 |

OTHER PUBLICATIONS

Kubernetes, "Large-scale network simulations in Kubernetes, Part 1—Building a CNI plugin", pp. 1-13. (Year: 2018).*

(Continued)

*Primary Examiner* — Kevin L Young
*Assistant Examiner* — Phuong N Hoang
(74) *Attorney, Agent, or Firm* — Dority & Manning, P.A.

(57) ABSTRACT

Systems and methods for simulating containerized clusters. An example method may include determining a first value of an entity property that characterizes a simulated cluster entity in a containerized cluster entity, where the first value of the entity property is determined in view of an entity simulation specification associated with the simulated cluster entity, identifying one or more simulation policies that correspond to the simulated cluster entity, the simulation policies comprising a value generation policy that specifies a modification factor, the entity property, and one or more entity modification criteria. The example method may further include responsive to determining that the one or more entity modification criteria are satisfied, determining a second value of the entity property in view of the first value of the entity property and the modification factor, and generating simulation output comprising the second value of the entity property.

20 Claims, 6 Drawing Sheets

(56) References Cited

U.S. PATENT DOCUMENTS

| | | | | |
|---|---|---|---|---|
| 2012/0167084 | A1* | 6/2012 | Suit | G06F 11/3433 |
| | | | | 718/1 |
| 2013/0145367 | A1* | 6/2013 | Moss | G06F 9/45558 |
| | | | | 718/1 |
| 2013/0346993 | A1* | 12/2013 | Chen | G06F 9/5072 |
| | | | | 718/103 |
| 2014/0380307 | A1* | 12/2014 | Zhu | G06F 9/5011 |
| | | | | 718/1 |
| 2015/0370583 | A1 | 12/2015 | Shah et al. | |
| 2018/0109610 | A1* | 4/2018 | Einkauf | H04L 67/10 |
| 2018/0349363 | A1* | 12/2018 | Jujjuri | G06F 16/27 |
| 2020/0250002 | A1* | 8/2020 | Gururaj | G06F 9/5027 |
| 2020/0342148 | A1* | 10/2020 | Banks | G06F 9/54 |
| 2020/0409761 | A1* | 12/2020 | Stuntebeck | G06N 20/00 |
| 2021/0141708 | A1* | 5/2021 | Mathur | G06F 11/323 |
| 2021/0149744 | A1* | 5/2021 | Sharma | G06F 11/3006 |
| 2021/0357556 | A1* | 11/2021 | Venkatapurapu | G06V 10/776 |
| 2021/0397465 | A1* | 12/2021 | Mellquist | G06F 9/45541 |

OTHER PUBLICATIONS

Abhilasha Singh, "A Simulation Based Analysis and Modeling of Workload Patterns using the CloudSim Toolkit", Department of Computer Science and Engineering, M.S Ramaiah Institute of Technology, Karnataka, India, https://www.ijser.in/archives/v3i7/IJSER15304.pdf, pp. 36-40, 2014.

* cited by examiner

SIMULATING CONTAINERIZED CLUSTERS

TECHNICAL FIELD

The present disclosure is generally related to system management, and more particularly, to simulating containerized clusters.

BACKGROUND

Cluster computing environments can provide computing resources, such as host computer systems, networks, and storage devices that can perform data processing tasks and can be scaled to handle larger tasks by adding or upgrading resources. Virtualization techniques can be used to create multiple "virtual machines" on each physical host computer system, so the host computer systems can be used more efficiently and with greater flexibility. A hypervisor may run on each host computer system and manage multiple virtual machines. Such virtualization techniques thus provide abstractions of the physical components into logical objects in order to allow running various software modules, for example, multiple operating systems, concurrently and in isolation from other software modules, on one or more interconnected physical computer systems. Virtualization allows, for example, consolidating multiple physical servers into one physical server running multiple virtual machines in order to improve the hardware utilization rate.

BRIEF DESCRIPTION OF THE DRAWINGS

The present disclosure is illustrated by way of examples, and not by way of limitation, and may be more fully understood with references to the following detailed description when considered in connection with the figures, in which.

DETAILED DESCRIPTION

Figure 1:
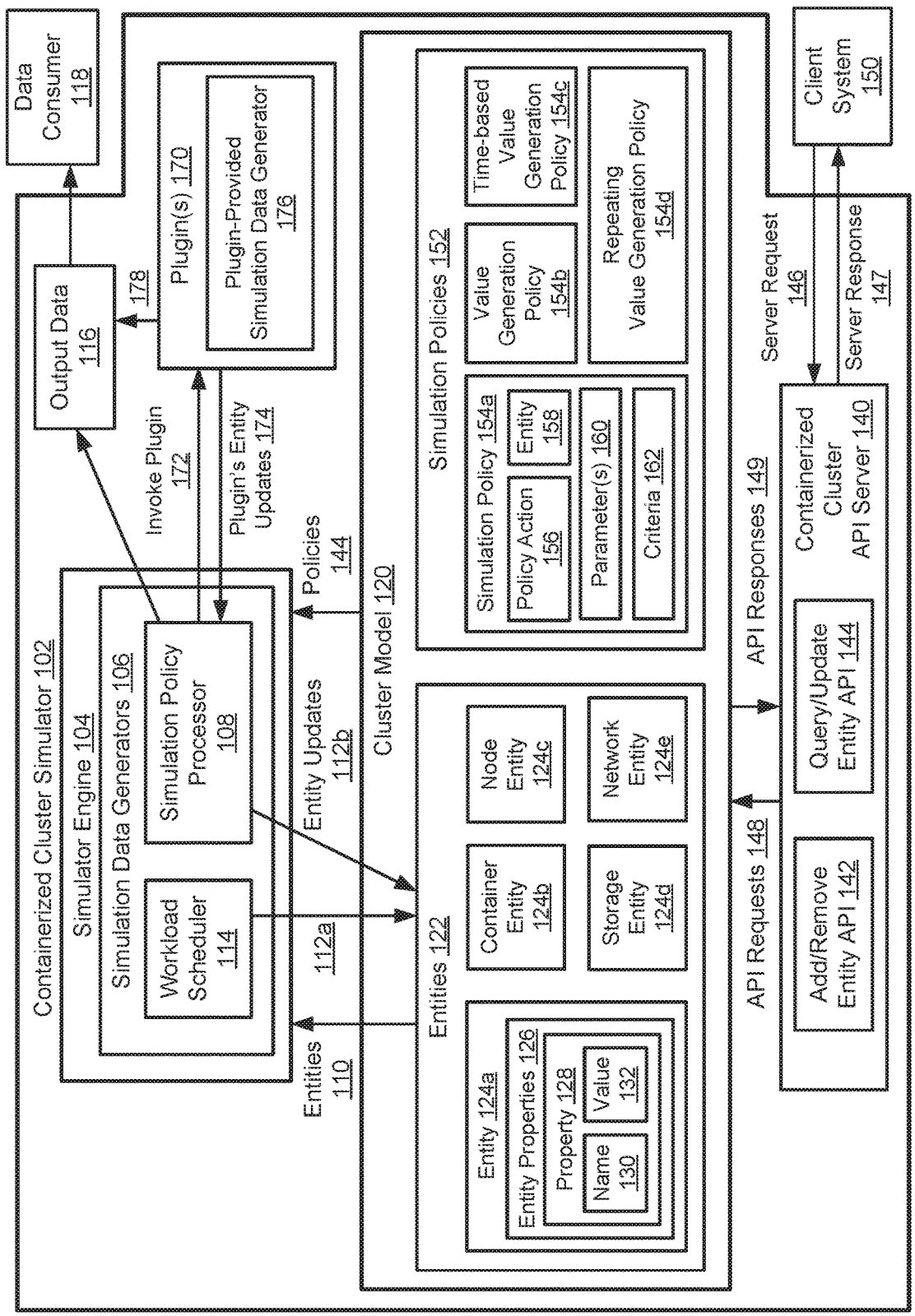
FIG. 1 depicts a block diagram of an example containerized cluster simulation system that uses simulation policies, in accordance with one or more aspects of the present disclosure.

Described herein are systems and methods for simulating containerized clusters. In general, a containerized cluster may be a cluster of physical or virtual host machines that run containerized applications. The containerized cluster may include entities that represent resources in the cluster, such as virtual machines, nodes, persistent volumes, and networks. A containerized application may run in association with a container, which may handle infrastructure-related tasks such as deployment of the application for operation. The container may include the application and the application's dependencies, which may include libraries and configuration information.

Containerized clusters can have numerous components and can depend on numerous other external components such as databases, networks, operating systems, compute nodes, and so on. Because of this complexity, using and managing containerized clusters can be time consuming. For example, starting and stopping a containerized cluster can be time-consuming operations, and can fail if a component or dependency, such as a compute node, is improperly configured or not available. Tasks that involve using containerized clusters, such as development and testing of a component that is external to and uses a containerized cluster, such as a management system, can involve devoting substantial time and effort to operation and maintenance of the containerized cluster. Further, the behavior of a containerized cluster, such as memory and CPU usage, can be difficult to control as precisely as desired for purposes of testing external components such as management systems.

Aspects of the present disclosure address the above-noted and other deficiencies by providing technology that enables simulation of containerized clusters. A containerized cluster simulator can simulate containerized cluster entities, such as containers, nodes, persistent volumes, networks, and the like, by generating simulated values of particular properties of cluster entities and providing the simulated values to client applications, such as monitoring systems or other clients of the simulated containerized cluster, via a containerized cluster interface. Simulated entity properties can include, for example, the number of CPUs on a node, the amount of available memory and CPU resources on the node, and so on. The simulator can receive requests via the containerized cluster interface from a client application to perform simulated operations, such as requests to add or remove cluster nodes or perform specified workloads. Instead of performing the operations or executing the workloads as would be done by an ordinary (e.g., non-simulated) containerized cluster, the simulator can modify the values of simulated entity properties to simulate performing the operations or executing the workloads. For example, the client application may send a request to start a workload to the simulator, and the simulator may create a simulated pod and container entities to process the workload. A container entity can represent an execution environment in which applications run. A pod entity can represent a set of containers that share resources, similar to a logical host machine.

As an example, the simulator can examine container entities created by clients to perform workloads, identify simulated node entities that are available to execute the workload, schedule the container entities to execute on the identified node entities, and update the values of entity properties of the identified node entities and container entities at suitable times to simulate the processing of the workload. The values of the entities properties can be updated as specified by simulation policies. A simulation policy can specify a policy action to be performed by the simulator, a corresponding entity, and one or more policy criteria. The policy action specifies an action to be performed, such as generating a value for an entity property, invoking the action or another policy at a specified time, repeating the action or another policy at one or more specified times or in response to the policy criteria being satisfied (e.g., having a Boolean value of "true") or invoking the action or another policy in response to the policy criteria being satisfied. The corresponding entity identifies a simulated entity on which the policy action is to be performed. Thus, the pod and container entities can be simulated without deploying ordinary (non-simulated) pod and container entities in an ordinary containerized cluster.

The simulator can generate output data from the simulated properties of the cluster entities, such as memory and CPU usage metrics over time, and send the output data to monitoring systems, logs, or other consumers of simulator output data. For example, the simulator can copy the name and value of a simulated property to a cluster metric, and send the cluster metric to a monitoring system. Simulation policies can be specified to cause the simulated values of entity properties to deviate by specified factors or percentages, as well as change over time or in response to conditions specified as functions of the simulated state of the containerized cluster. For example, a policy can specify that the memory use property of a node entity in a simulated cluster is to spike to 90% of the node's memory capacity for 20 seconds, then return to a previous simulated value. The resulting modified entity property values can then affect subsequent operation of the simulator. The policy can also specify that the generated values are be sent to endpoints. The generated values can be, for example, cluster metrics, and the cluster metrics can be sent to endpoints.

The containerized cluster interface provided by the simulator, being compatible with the interface provided by non-simulated containerized clusters, can be used by client programs to interact with the simulator as if it were a non-simulated containerized cluster. As an example, the simulator may be used to test the operation of other systems that interact with containerized clusters as clients via the containerized cluster interface by simulating the execution of workloads as described above. The other systems that interact with the simulator can be, for example, performance monitoring systems, application monitoring systems, data logging systems, and so on. The simulator may also provide a plugin interface that can be used by plugins or other program code to extend the simulator with additional entity types and additional policy types.

Advantages of the present disclosure include, but are not limited to, the ability to quickly start, stop, and execute simulated workloads using the containerized cluster simulator, so that client applications using the containerized cluster simulator can be operated and tested more efficiently than with a non-simulated containerized cluster. Further, the behavior of specific entities and entity properties in a containerized cluster can be controlled to a high degree of precision, so a wide variety of different operating conditions of an application that uses the simulator can be tested by instructing the simulator to produce output simulating the operating conditions. Generating such particular desired values of output data from a non-simulated containerized cluster can be difficult and time-consuming because, for example, entity properties are not ordinarily directly controllable in a non-simulated cluster. Further, operating the simulated containerized cluster can be less complex and more efficient than operating a non-simulated containerized cluster. For example, the amount of time needed to start a simulator can be substantially less than the amount of time to start a non-simulated containerized cluster, so external components that interact with the simulator can be tested more quickly and efficiently.

Various aspects of the above referenced methods and systems are described in details herein below by way of examples, rather than by way of limitation. The examples provided below discuss techniques for simulating containerized clusters.

FIG. 1 depicts a block diagram of an example containerized cluster simulator 102 in a computing environment 100, in accordance with one or more aspects of the present disclosure. The containerized cluster simulator 102 may run on one or more computer systems, and may simulate aspects of the operation of a containerized cluster. A containerized cluster may be a deployment of containerized cluster computer program code running on a set of computer systems referred to as "nodes." The node computer systems may run containerized applications and are represented in the containerized cluster as node entities. The node entities can be used to manage the node computer systems by invoking, via an Application Programming Interface ("containerized cluster API"), operations (e.g., create, update, and delete operations) with the node entities as parameters. The containerized cluster includes other entities that represent other cluster resources. The entities can include containers, pods, persistent volumes, networks, namespaces, persistent volume claims, storage classes, custom resources, and others. A container entity can represent an execution environment in which applications run. A pod entity can represent a set of containers that share resources, similar to a logical host machine. A persistent volume (PV) entity can represent a persistent storage device such as a disk. A namespace entity can represent a scope for resource name. A persistent volume claim (PVC) entity can represent a request for storage that can be fulfilled by persistent volumes. A storage class entity can represent a classes of storage, such as a particular quality of service level. A custom resource entity can represent a resource that is an extension of the containerized cluster API that is not necessarily available in a default containerized cluster installation. A custom resource may be a virtual machine, for example. Custom resources can be represented as cluster entities, e.g., virtual machine entities, which may be provided by a virtual machine custom resource.

Each cluster entity can be associated with an entity specification that specifies information associated with the cluster entity, such as default values or current values of entity properties. The information in an entity specification can be represented as a set of name-value pairs. An entity specification ordinarily includes values that may change in response to an externally-triggered request to update the values. An externally-triggered request may be a server request 146 from a client system 160. Other data in the simulator 102, such as entity property values 132, may change in response to internal simulator operation. For example, a node entity specification can have a memory capacity property that indicates the memory capacity of the node (which may be, for example, the memory capacity of the host computer system represented by the node). The memory capacity may be specified using a name such as "node_mem_capacity_gb" and a value such as "16".

Further, each cluster entity can have a set of entity properties, which can represent information that can change while the containerized cluster is running. Each entity property can be represented as a name-value pair. For example, a node entity can have a memory used property that indicates the amount of memory capacity that is in use on the node as of the time the memory used property is generated. The memory used property may have a name such as "node_mem_used_mb" (node memory used in megabytes) and a value such as "256".

Computer simulation can involve performing a simulation process on a computer system that uses a model of a target system to simulate the behavior of the target system. The target system, which is being simulated, can be another computer system or computing environment, a real-world system, a physical system, or other system for which a model can be constructed using a process on a computer system. The simulation model and associated program code, such as program code to provide input to and process output from the simulation model, including control operations and data storage and retrieval, can be referred to as a simulator. The simulator can provide an interface, such as a user interface or application programming interface ("API"), sufficiently similar to the interface of the target system being simulated that the simulator appears, to users or client programs, to be similar to the target system being simulated.

A client system 150 can interact with the simulator 102 via a containerized cluster API. The client system 150 can submit workload requests to the simulator 102 by, for example, submitting container descriptions specifying applications to be executed. The client system 150 may be, for example, a monitoring system, logging system, a system used to test containerized clusters, or other suitable client. The workload requests may include requests to create containers to perform specified workloads on specified nodes, or requests to create nodes that can be used to perform workloads. The information submitted to the simulator 102 by the client system 150 via the containerized cluster API is shown as a server request 146. A containerized cluster API server 140 receives each server request 146 and invokes API operations specified by the server request 146 by sending an API request 148 to a cluster model 120 associated with a simulator engine 104. The server requests 146 may be Representational State Transfer ("REST") operations or the like. The API server 140 may send the API requests to the cluster model 120 via a simulator engine 140. The API operations may include add entity or remove entity operations 142, query entity or update entity operations 144, and other operations that send information to or receive information from the cluster model 120. The simulator engine 104 can perform simulator actions that simulate the operations specified in the API requests 148 and send API responses 149 (e.g., success or error status) and results (e.g., requested information about the cluster model 120) to the API server 140 in API responses 149. The API server 140 may send the information in the API responses 149 and/or the results received from the engine 104 to the client system 150 in one or more server responses 147.

The simulator 102 can simulate the operation of a containerized cluster and generate output, such as server responses 147 and output data 116. The generated output data 116 can be, for example, cluster metrics or other information related to the state of the cluster model 120. The simulator 102 does not ordinarily perform operations that are performed by a non-simulated containerized cluster, such as operations involved in deploying a containerized cluster and executing applications in containers. The output of the simulator 102 can be generated from the cluster model 120, which includes a set of simulated entities 122 and simulation policies 152. The set of simulated entities 122 contains at least one simulated entity 124, which can represent the containerized cluster entity described above. Each simulated entity 124 can be of a particular entity type. An entity type may be, for example, container, node, storage, network, namespace, pod, and so on. Example simulated entities 122 include a container entity 124b, a node entity 124c, a storage entity 124d, and a network entity 124e. These simulated entities 122 can be created, updated, and deleted by the containerized cluster API server 140 and the simulator engine 104 to simulate a containerized cluster. Although not shown, the entities 122 may include other types of simulated entities, such as pod entities and other simulated entities that represent other types of containerized cluster entities.

Each entity 124 can include one or more entity properties 126, which may represent a state of the entity 124. Each entity property 128 may include a name 130 and a value 132. The particular set of properties 126, e.g., the property names 130, can be different for different types of entities 124. Each entity 124a can have different property values 132, so different entities 122 of the same type can have different property values 132. As an example, a container entity property representing the amount of memory used by a container entity (in megabytes) may have the name "container_mem_used_mb" and the value "128." Entity property names and values can be used as output from the simulator 102, e.g., by sending the entity property names and values to the client system 150 in a server response 147. Output data 116 can also be generated based on entity properties 126 and sent as output to a data consumer 118, such as a log or a performance monitoring system. The output data 116 can be from simulation policies or plugins, for example. The output data 116 can include one or more entity property names and values generated by simulation policies or plugins. A plugin 170 can send plugin output data, such as entity property names and values generated by the plugin, to a data consumer 118 as output data 116 (as shown by arrow 178). A plugin can alternatively or additionally provide the plugin output data to the simulator engine 104, which can send the plugin output to the data consumer 118 as output data 116. The output data 116 can be determined using a transformation of the entity property names and/or entity values. For example, if an entity property name is "memory of container X," where X is the name of a container associated with the entity property, the output data can be the text "the memory of container X exceeds threshold of 4g." The output data 116 can be sent to an external system such as the data consumer 118.

The output data 116 can include one or more simulation metrics. For example, a simulation metric having a type name "container_mem_used_mb" can be generated from the "container_mem_used_mb" property. The "container_mem_used_mb" metric may include the type name and the name-value pairs container="Container1", pod="Pod1", value="128", and timestamp="10 June 2020 10:52 AM" to indicate that the metric is for the container named "Container1" in the pod named "Pod1", has the value "128", and was generated on 10 Jun. 2020 at 10:52 AM. The entities 122 can include one or more container entities 124b, one or more node entities 124c, one or more storage entities 124d, one or more network entities 124e, and/or one or more other entities, such as custom resources that represent custom entities (e.g., virtual machines).

Entity property values 132 can be generated by the engine 104 in accordance with entity specifications, workload requests, simulation policies, plugin-provided instructions, or other suitable information or instructions. An entity specification can be associated with each entity 124a, and can specify default values for the entity 124a. An entity specification can specify an entity name, type, property names and types, and default property values. Entity specifications of particular entities may be based on a default entity type specification associated with an entity type. For example, a container entity named "Container A" can have a specification indicating the entity's name ("Container A"), type ("Container"), properties ("memory_used_mb" and "cpu_used_cores"), and default property values ("memory_used_mb=128" and "cpu_used_cores=0").

The simulator 102 can generate outputs, such as modified values 132 of the entity properties 126, output data 116, and the like, using simulation data generators 106. The simulation data generators 106 can update the states of entities 122 (e.g., by setting the values of entity properties 126) to simulate the operation of a containerized cluster represented by the cluster model 120. The simulation data generators 106 may include a workload scheduler 114 and a simulation policy processor 108.

The workload scheduler 114 can set the states of entities 122 to simulate the execution of specified workloads. The workload scheduler 114 can examine container entities 124b created by the API server 140, identify which of the node entities 124c are available to execute the workload, schedule the container entities to execute on one or more of the identified node entities 124c, and update the values of entity properties of the determined node entities 124c and container entities at suitable times to simulate the processing of the workload (as shown by arrow 112a). For example, to simulate the start of workload processing, the workload scheduler 114 may set the "container_mem_used_mb" property value of a container entity created for the workload to a container memory size value related to the size of the workload, and increase a node memory used property value of the identified node entity by the container memory size value (arrow 112a). The workload scheduler 114 may simulate completion of the workload by reducing the "container_mem_used_mb" and the node memory used property values by the container memory size value at a time determined in accordance with the amount of CPU resources requested for the workload and the processor speed property of the node entity, for example (arrow 112a).

The simulation policy processor 108 can set the states of entities 122 in accordance with simulation policies 152. Each simulation policy 154 can specify one or more policy attributes that characterize the policy 154. As shown in an example simulation policy 154a, the policy attributes can include a policy action 156 to be performed by the engine 104, a corresponding entity attribute 158 ("corresponding entity" as used herein may refer to the attribute 158 of the simulation policy, which may identify another entity by reference), one or more parameters 160, and one or more policy criteria 162. The policy action 156 specifies an action to be performed, such as generating a value for an entity property, invoking another policy at a specified time, repeating another policy at one or more specified times or in response to criteria 162 being satisfied, or invoking another policy in response to a specified condition being satisfied. The corresponding entity 158 identifies one or more of the entities 122 to which the policy 154 applies. The corresponding entity 158 may be correlated with the policy 154 via, e.g., a label in the cluster model 120, an entity identifier, or other association. The parameters 160 can specify information to be used by the policy action 156, and can include different parameters for different types of policies. For example, for a value generation policy 154b, the parameters 160 may include a property identifier parameter that identifies an entity property (of the corresponding entity 158) to be modified and a modification amount parameter. The policy criteria 162 may be used by the engine 104 to determine whether to perform the policy action 156. Default values may be used for policy attributes that are not specified. For example, if the policy action 156 is not specified in a policy 154, the policy 154 may default being to a value generation policy 154b. As another example, if the criteria 162 are not specified, the policy action 156 may be performed without checking the criteria 162.

Simulation policies 152 can be received from client system 150 or other sources external to the containerized cluster simulator 102. The simulator 102 may also include "built-in" policies 152, which may be provided with the simulator 102. For example, a user of the client system 150 may create or modify one or more simulation policy definitions (not shown), such as a policy definition for a value generation policy, using a suitable user interface, and submit the simulation policy definitions to the containerized cluster simulator 102 via a simulation policy management API (not shown) of the API server 140. The API server 140 may send the simulation policy definitions to the cluster model 120 for storage as simulation policies 152. The cluster model 120 may generate the simulation policies 152 from the policy definitions and provide the simulation policies 152 to the simulator engine 104. The simulator engine 104 may query the cluster model 120 for the simulation policies 152, or for simulation policies 152 having a corresponding entity 158, or having other particular attribute values, and the cluster model 120 may provide simulation policies 152 matching the query to the simulator engine 104.

The simulation policies 152 may include a value generation policy 154b, which may specify actions that set or modify values of entity properties 126 by specified amounts (e.g., by specified percentages or factors). A value generation policy may specify that a value 132 of an entity property 128 (of a specified corresponding entity 158) is to be set to a value specified by one of the parameters. For example, a container memory-used policy that generates values for a "container_mem_used_mb" property may specify an action 156 that corresponds to generating an entity property value, a corresponding entity 158 that identifies a container entity 124b, and a value to be stored in the entity property (e.g., "128").

The simulator engine 104 may detect the memory-used policy in the simulation policies 152 (e.g., by receiving a change notification), retrieve the memory-used policy (arrow 144), generate an updated property value from the parameter ("128"), and store the updated property value as the value of the "container_mem_used_mb" property of the container entity 124b identified by the corresponding entity 158 of the memory-used policy (arrow 112b). Thus, the container memory-used policy causes the "container_mem_used_mb" property of a specified container entity 124b to be set to a specified value (e.g., "128"). Alternatively, the specified value may be specified as a percentage or factor relative to the value of the property to be updated (e.g., increase the value by 10% or multiply the value by a factor of 1.1). Although a particular policy, action, entity, and modification are described in the preceding example, any suitable policy, action, entity, and modification may be performed by the simulation policy processor 108.

The example container memory-used policy described above does not specify criteria 162, so the simulation policy processor 108 may perform the policy action 156 of the memory-used policy in response to detecting the presence of the memory-used policy in the simulation policies 152. If the memory-used policy specifies criteria 162, then the simulation policy processor 108 may perform the policy action 156 specified by the memory-used policy in response to determining that the criteria 162 have been satisfied. For example, the criteria 162 may be that the value of the "container_mem_used_mb" property of the container entity 124b (identified by the policy's corresponding entity 158) is less than a threshold value, such as 10% of a "container_ mem_limit_mb" property of the container entity 124b. The simulation policy processor 108 may determine whether the criteria 162 are satisfied, and, if so, generate an entity update (arrow 112b) to increase the value of the "container_mem_used_mb" property by 30%. If the criteria 162 are not satisfied, the simulation policy processor 108 may wait for the criteria 162 to be satisfied, e.g., by monitoring updates to the properties referenced by the criteria ("container_mem_used_mb" and "container_mem_limit_mb") and evaluating the criteria in response to each update. In response to subsequently detecting that the criteria 162 are satisfied, the simulation policy processor may perform the policy action 156, e.g., increase the value of the "container_mem_used_mb" property by 30%. A second policy 162 may be used to subsequently reduce the value of the "container_mem_used_mb" property. The second policy may include criteria 162 that is satisfied when the value of the "container_mem_used_mb" property of the container entity 124b identified by the policy's entity corresponding entity 158 is greater than a threshold value, such as 80% of a "container_mem_limit_mb" property of the container entity 124b. The second policy may also have parameters 160 specifying that the value of the "container_mem_used_mb" property is to be decreased by 30%. Although criteria that use particular values of entity properties are described in the examples above, the criteria may use other suitable data in the cluster model 120, such as the number of entities of a particular type in entities 122, or the amount of time since an entity property was last updated.

The simulation policies 152 can include time-based policies, which can specify that an action or a particular designated policy is to be performed at a specified time and/or for a specified duration of time. For example, a time-based value generation policy 154c may be a value generation policy that includes time-based criteria 162, such as a start time and a time duration. As an example, a time-based value generation policy 154c may be used to simulate a CPU usage spike to 90% of the CPU usage limit in a simulated pod entity by causing the simulated CPU usage of a pod entity to be increased to 90% of the pod's simulated CPU usage limit for 30 seconds after the pod entity is created. The CPU spike may be generated using a time-based value generation policy 154c (or, alternatively, using a time-based policy 254c that designates a value generation policy to be performed, as described below with reference to FIG. 2). To generate the CPU spike using a time-based value generation policy 154c, the policy's corresponding entity 158 may be set to identify a pod entity, a start time parameter 160 of the policy 154c may be set to 0 (or omitted) to indicate that the policy action 156 (generating a value for an entity property) is to be performed in response to creation of the pod entity, and a time duration parameter 160 of the policy may be set to 30 seconds. The parameters 160 of the policy 154c may further be set to specify that the pod entity's "pod_cpu_used_cores" property is to be increased to 90% of the pod entity's "pod_cpu_limit_cores" property by, for example, specifying an expression such as "0.9*pod_cpu_limit_cores" in a specified value parameter.

The time-based value generation policy 154c can include an option that, after the time duration has passed, restores the entity property value to the value it had prior to being changed by the policy. This option can be used to cause the pod's CPU usage to return, after the 30 seconds time duration, to the value it had prior to being increased by 90%. For example, a time-based policy 254c shown in FIG. 2 can be used to set the pod's CPU usage to 90% of the pod's simulated CPU usage limit for 30 seconds after the pod entity is created and restore the previous value after 30 seconds have passed. The time-based policy 254 restores the previous value responsive to expiration of the duration 276 if the restore previous value parameter 278 is true. Thus, a time-based policy 254c may be used for this example scenario by setting a start time 274 of the policy 254c to 0 and a duration 275 of the policy 254c to 30 seconds, and a "restore previous value" parameter 278 of the policy 254c to "true".

As another example, the time-based value generation policy 154c can store the previous value of an entity property in a memory location prior to setting the entity property to a different value, and a second time-based value generation policy 154c can be used to set the pod entity's "pod_cpu_used_cores" property to the stored previous value. The time-based policy 154c can have a start time parameter 160 value of 30 seconds to indicate that the policy action 156 (setting the entity property to the stored previous value) is to be performed 30 seconds after creation of the pod entity. The time-based policy 154c can have a time duration parameter 160 value of 0 seconds to specify that there is no duration of time associated with the policy action.

The simulation policies 152 can include repeating policies, which can specify that an action or a particular designated policy is to be performed repeatedly. A repeating policy can specify parameters 160 that characterize the repetition, such as a time period between repetitions, a number of repetitions to be performed. Additionally or alternatively, the repeating policy may specify repetition criteria 162 that control whether to stop the repetitions. If the repetition criteria are specified for a repeating policy, then each subsequent repetition occurs in response to the repetition criteria being satisfied. If the repetition criteria 162 are not satisfied prior to performing a subsequent repetition, then the subsequent repetition is not performed. For example, a repeating value generation policy 154d may be a value generation policy that includes repetition parameters 160 such as the time period between repetitions and/or the number of repetitions to be performed, and may also specify the repetition criteria.

As an example, a repeating value generation policy 154d may be used to simulate repeating memory spikes of 20% in a pod relative to the pod's requested amount of memory every 20 seconds. The repeating memory spike may be generated using a repeating value generation policy 154d (or, alternatively, by using a repeating policy 254b that designates a value generation policy to be performed, as described below with reference to FIG. 2). To generate the CPU spike using a repeating value generation policy 154d, the policy's corresponding entity 158 may be set to identify a pod entity, and a time period parameter 160 of the value-generation policy 154d may be set to 20 seconds to indicate that a repetition of the policy action 156 (generating a value for an entity property) is to be performed every 20 seconds (the first repetition may be performed, e.g., in response to creation of the pod entity). The parameters 160 of the policy 154d may be set to specify that the pod entity's "pod_memory_used_mb" property is to be increased to 20% above the pod entity's "pod_memory_requested_mb" property by, for example, specifying the property name "pod_memory_used_mb" in a property parameter and specifying an expression such as "1.2*pod_memory_requested_mb" in a specified value parameter. If a particular number of repetitions are desired, a "number of repetitions" parameter 160 can be set to the number of repetitions desired, or repetition criteria 162 can be set to criteria that, if not satisfied, causes the repetitions to stop.

Two or more simulation policies 152 can be combined to form a sequence of policies. The simulator engine 104 may invoke the policies according to the order specified by the sequence. For example, a sequence of policies may include a value generation policy 154b that increases a pod entity's "pod_memory_used_mb" property by 20% and a time-based value generation policy 154c that waits for 30 seconds, then reduces the pod entity's "pod_memory_used_mb" property by 50%. Since the policies are invoked in sequence order, the simulator engine increases the "pod_memory_used_mb" property by 20%, waits for 30 seconds, then reduces the pod entity's "pod_memory_used_mb" property by 50%.

The simulator 102 can include one or more simulator plugins 170, which can generate entity property values. The plugins 170 can be provided by users of the simulator to perform user-defined operations for existing cluster entity types or for user-defined "custom" entity types. Thus, a plugin 170 can be associated with a particular type of cluster entity 124. The simulator engine 104 can invoke computer program code provided by the plugin, at defined points during the simulation, for each cluster entity 124, to cause the plugin 170 to generate entity property values for the cluster entity and perform other plugin-specific operations. For example, the simulator engine 104 can invoke the program code of each plugin 170 prior to and subsequent to the generation of each entity property value by the engine 104. The simulator engine 104 can also use an entity property value generated by the plugin 170 instead of or in combination with the value generated by the engine. In this way, plugins can perform operations based on entity property values and can also modify entity property values during simulation.

Simulator plugins 170 can be added to or interfaced with the simulator 102 to extend the features of the simulator 102. A simulator plugin 170 can include instructions, such as computer program code, that generate simulation data and provide the generated simulation data to the simulator engine 104. A simulator plugin 170 can also implement additional types of entities 122, referred to herein as custom resource entities. The custom resource entities may be added to the cluster model 120 and processed by simulation data generators 106 and the plugins 170 to generate simulation data such as entity updates (e.g., values of entity properties). The plugins 170 may interact with the engine 104 via a plugin interface, which can include operations for registering a plugin 170 (e.g., associating a plugin 170 with a particular entity type), specifying conditions or instructions for invoking the plugin 170, invoking the plugin 170 from the engine 104 (arrow 172), invoking the engine 104 from the plugin 170 (arrow 174), which can include sending entity updates from the plugin 170 to the engine 104, and generating output data 116 (arrow 178), which may be sent to one or more data consumers 118. The data consumers may be, for example, monitoring systems, logging systems, third-party tools, or other consumers of simulation data. Plugins 170 may send output data 116 to third-party tools, e.g., by sending logs to a remote system logging server, or sending events to a third-party monitoring tool. Plugins 170 may be included in default configurations of the simulator 102 (e.g., provided with the simulator 102), or may be provided separately from the simulator (e.g., by a third party) and registered with the simulator 102 to extend the simulator 102.

Each plugin 170 may be associated with one or more entity types (e.g., container, node, or other entity type), and the simulation policy processor may invoke the plugin 170 associated with an entity type when generating entity updates for each entity of that type. The association between a plugin and an entity type may be established when the plugin is registered, for example. The simulation policy processor 108 may send an "invoke plugin" request (arrow 172) to a plugin 170 to cause the plugin 170 to generate entity updates (or other simulation data). A plugin-provided simulator data generator 176 may generate entity updates similarly to the simulation policy processor 108 (as described above). The cluster model 120 may be provided to the plugins 170, and the plugins 170 may retrieve values of entity properties from the cluster model 120. The simulation policy processor 108 may receive the entity updates (arrow 174) and send the entity updates to the cluster model 120 (arrow 112b). The simulation policy processor 108 may identify the particular plugin 170 to invoke by looking up the plugin associated with the entity in a lookup table. Plugins 170 may thus provide custom value generation simulation policies by generating entity property values for the entities associated with the plugins. Plugins 170 may implement custom "control flow" simulation policies 152 as described below with reference to FIG. 2. In one example, the containerized cluster simulator 102 may run on a non-simulated containerized cluster (not shown), e.g., in one or more containers on one or more nodes of the non-simulated containerized cluster.

Figure 2:
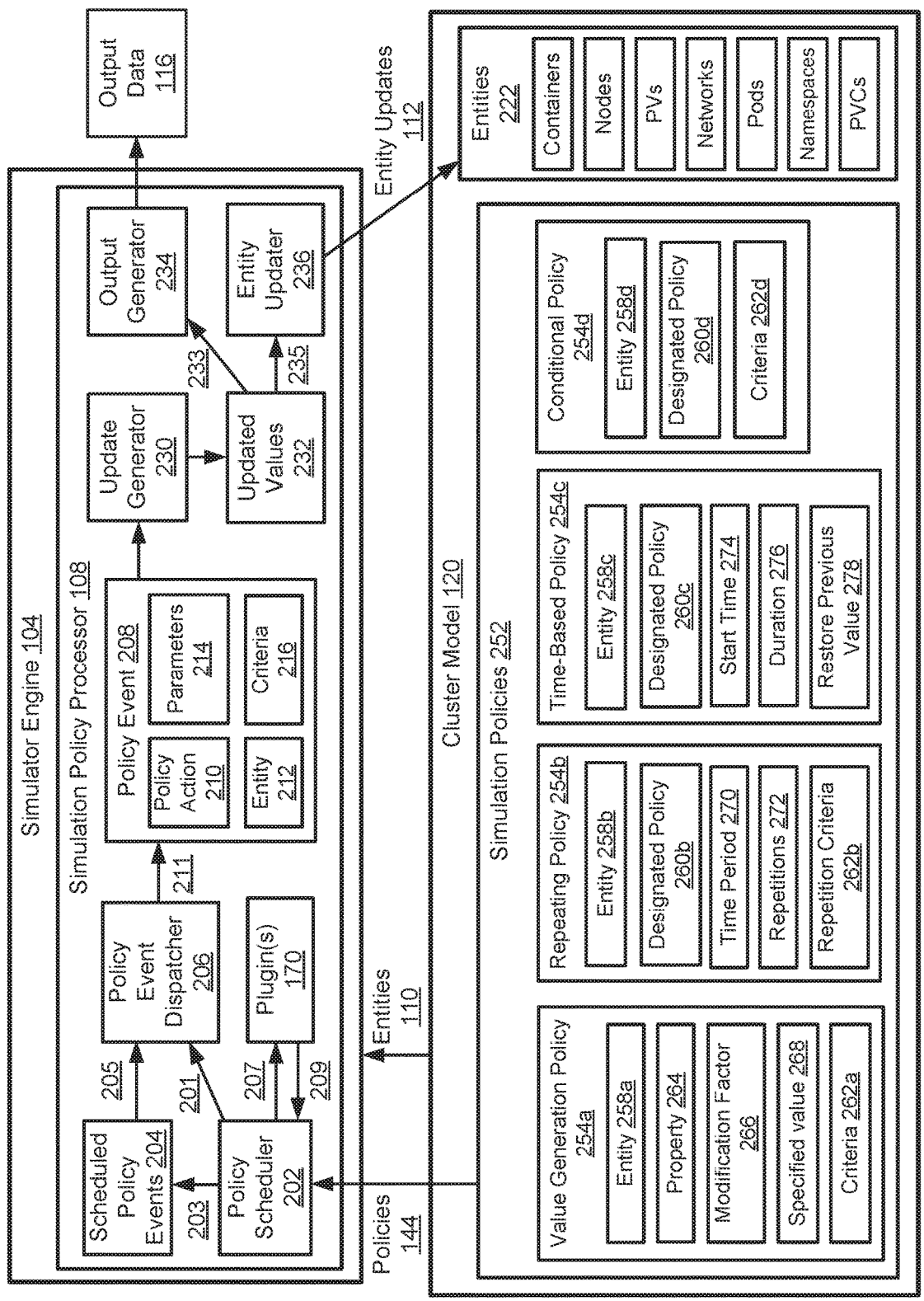
FIG. 2 depicts a block diagram illustrating a simulation policy processor 108 and example simulation policies 252, in accordance with one or more aspects of the present disclosure.

FIG. 2 depicts a block diagram illustrating a simulation policy processor 108 and example simulation policies 252, in accordance with one or more aspects of the present disclosure. The simulation policy processor 108 may be a component of the simulator engine 104 and may generate simulation data, such as updated entity values (arrows 112) and output data 116 by processing policies 252 and entities 222 received from a cluster model 120 (arrows 144 and 110), as described above with reference to FIG. 1. The entities 222 may include containers, nodes, persistent volumes (PVs), networks, pods, namespaces, and persistent volume claims (PVCs), for example.

The cluster model 120 includes example simulation policies 252 and example entities 222. The simulation policies 252 include a value generation policy 254a, a repeating policy 254b, a time-based policy 254c, and a conditional policy 254d. The value-generation policy 254a, which corresponds to the value generation policy 154b of FIG. 1, includes an entity 258a, an entity property 264, a modification factor 266, a specified value 268 (which may be used as a value for an entity property as an alternative determining a value using the modification factor 266), and criteria 262a. The repeating policy 254b may include an entity 258b, a designated policy 260b to be performed repeatedly, a time period 270 between repetitions of the designated policy 260b (or other action specified by the repeating policy 254b), a number of repetitions 272 to be performed, and repetition criteria 262b. If specified, the repetition criteria 262b may be used to determine whether to perform each subsequent repetition. The time-based policy 254c may include an entity 258c, a designated policy 260c to be performed at a specified time or times, a start time 274 at which to perform the designated policy (or other action specified by the designated policy 260c), a time duration 276 for which the designated policy 260c or other action is to be performed, and a "restore previous value" parameter 278 indicating whether a previous value is to be restored after expiration of the time duration 276. The conditional policy 254d includes an entity 258d, a designated policy 260d, and criteria 262*d* to determine whether to perform the designated policy 260*d* or other specified action associated with the conditional policy 254*d*.

Multiple simulation policies 252 can be associated with an entity 254, in which case two or more of the policies 252 may conflict. A conflict resolution rule can specify that particular types of policies have higher priority than other types of policies. For example, a conflict resolution rule can specify that conditional policies 254*d* have higher priority than time-based policies 254*c*, which have a higher priority than repeating policies 254*b*, which have a higher priority than value generation policies 254*a*. Thus, for example, if an entity has both a time-based policy 254*c* and a conditional policy 254*d*, then according to the example rule, the conditional policy 254*d* is used when the condition is satisfied. There may be default conflict resolution rules, e.g., that the order of precedence from highest to lowest is conditional policies, time-based policies, and repetition policies. The default conflict resolution rules can be overridden by other rules specified via a simulator API.

The simulation policy processor 108 may access each of the received simulation policies 252, identify one or more policy actions to be performed for each policy 252, and schedule the policy actions to be performed at times specified by the policy. The times specified by the policy may be times in the future if the policy specifies time-related parameters or criteria that may be satisfied in the future. A policy may be subject to criteria that is implicit in the policy's attributes. For example, if the corresponding entity 158 associated with the policy has not yet been created (e.g., the corresponding entity 158 has an identifier, but has not been added to the cluster model 120 by the time that the policy is received by the engine 104), then the policy's action may be scheduled to be performed in response to creation of the corresponding entity 158. If the policy does not specify any time-related parameters or unsatisfied criteria, then the policy's action may be performed in response to receiving the policy without waiting for time to elapse or criteria to be satisfied. The policy processor 108 may perform each scheduled action at the action's scheduled time or, if the action is associated with criteria, when the action's associated criteria are satisfied.

In particular embodiments, the simulation policy processor includes a policy scheduler 202, which receives simulation policies 252 and entities 222 from the cluster model 120 (arrows 144 and 110, respectively) and, for each received policy 254, determines whether the policy 254 specifies any time-related parameters or unsatisfied criteria. If not, the policy scheduler 202 may send the policy 254 to a policy event dispatcher 206 (arrow 201). If the policy 254 does specify a time-related parameter or unsatisfied criteria, then the policy scheduler 202 schedules a policy event 208 that is to be sent to the policy event dispatcher 206 at a subsequent time (arrow 203). A policy event 208 may include a policy action 210, a corresponding entity 212, one or more parameters 214, and criteria 216 that may be specified to be satisfied prior to the policy action 210 being performed by the engine 104. For example, if the policy 254 specifies a start time, a policy event 204 may be scheduled to be dispatched to an update generator 230 at the start time. If the policy specifies criteria, such as a conditional expression that references one or more entities 222 or properties of the entities 222, then a policy event associated with the criteria may be added to scheduled policy events 204. The scheduled policy events may be, e.g., a set or queue of policy events that are waiting for their associated criteria to be satisfied or for a scheduled time to occur.

A policy event dispatcher 206 may retrieve a policy event from the scheduled policy events 204 (arrow 205) in response to the criteria associated with the policy event being satisfied. For example, the policy event dispatcher 206 may evaluate the criteria associated with each policy event in the scheduled policy events 204 in response to each update to a value of an entity 222 or of an entity property referenced by the criteria. If the criteria are satisfied by the updated value, then the policy event dispatcher 206 may perform a policy action 210 associated with the policy event 208 as described below.

The policy event dispatcher 206 may perform the policy action 210 by, for example, sending the policy event 208 to the update generator 230 if the action 210 specifies that the policy event 208 is to update a value. The policy event dispatcher 206 may perform other operations for other types of policy actions 210. For example, it the policy event 208 has a policy action 210 that specifies a repeating, time-based, or conditional action, the policy event dispatcher 206 may perform the specified action. If the parameters 214 associated with the action 210 specify that the action is to occur at a future time (e.g., a start time in the future), or criteria 216 associated with the action are not satisfied, the policy event dispatcher 206 may schedule appropriate policy events to perform the specified action 210. The action 210 may be, e.g., invoking another repeating policy 254*b*, invoking a time-based policy 254*c*, or invoking a conditional policy 254*d*. If the criteria 216 associated with the action 210 are satisfied, the policy event dispatcher 230 may perform the action instead of scheduling it to occur in the future. These policy actions 210 (generating a value, repeating an action, performing an action at a specified time, and performing an action responsive to specified criteria being satisfied) are described in further detail below. Although particular policy actions are described herein, other policy actions are contemplated and may be specified by a policy and performed by the simulation policy processor 108.

For policies that involve performing an action 210 at a specified time, the action 210 may be scheduled by the policy scheduler 202 as described above. For example, if a policy specifies a start time 274, a policy event 204 may be scheduled to be sent to the policy event dispatcher 206 at the start time. The policy event dispatcher 206 may dispatch the policy event 208 to cause the action to be performed responsive to the start time occurring. For example, if the event's policy action 210 specifies that a value is to be generated, the policy event dispatcher 206 may send the policy event to the update generator 230. If the event's policy action 210 specifies that an action other than generating a value is to be performed, e.g., repeating an action, performing an action at a specified time, or performing an action responsive to specified criteria being satisfied, then to dispatch the policy event 208, the policy event dispatcher 206 may perform the appropriate operations for those actions as described herein.

As another example of an action related to time, if the event's policy action 210 is a first action that specifies a time duration 276, then as part of performing the first action, the policy event dispatcher 206 may schedule a second action to occur in response to expiration of the time duration. The second action may, for example, reverse (or undo) the first action if the first action changed a value, or, as another example, stop the first action if the first action is still scheduled or active. As an example of reversing the first action, to increase an entity value (e.g., by 20%) for a specified amount of time, the first action may store a value of an entity property as a previous value prior to changing the entity property value. The second action, which may be scheduled to be performed responsive to expiration of the period of time, may retrieve the stored value and change the entity property to the stored value so that the 20% increase is reversed.

For policies that involve generating values, e.g., policy events 208 that have a policy action 210 specifying that a value is to be generated, the update generator 230 generates one or more updated values 232 in view of each policy event 208 received from the policy event generator (via arrow 211). The policy event 208 is associated with a policy and may include or reference attributes of the policy, including a policy action 210, a corresponding entity 212, one or more parameters 214, and criteria 216. The update generator 230 performs the policy action 210 on the entity 212 in accordance with the parameters 214. If the criteria 216 are specified by the policy event, the update generator 230 may verify that the criteria 216 is satisfied prior to performing the policy action 210. As an example, if the policy action 210 corresponds to generating a value, and the parameters include an entity property identifier and a modification factor, then the update generator 230 may identify the entity 212 in the cluster model, identify the property that corresponds to the entity property identifier specified by the parameters 214, and retrieve the existing value of the identified entity property from the cluster model 120 (arrow 110). The update generator 230 may then generate an updated value of the entity property by multiplying the existing value by the modification factor. An entity updater 236 may send the updated values 232 to the cluster model to update the corresponding entity properties of the entities 222 (arrow 112).

In one example, a policy event may have a policy action 210 that adds 20% to the "pod_cpu_used_cores" entity property's value. Since adding 20% corresponds to multiplying by a factor of 1.2, the modification factor in this example is 1.2. For an example pod entity 212 named "Pod1", and an entity property "pod_cpu_used_cores" having the value 10, the update generator may multiply the existing value by the modification factor of 1.2 to generate an updated value 232 of 12. The entity updater 236 may send an entity property update that includes an identifier for the entity ("Pod1"), the entity property name ("pod_cpu_used_cores") and the updated value 12 to the cluster model to be stored as a new value of the "pod_cpu_used_cores" property of the "Pod1" entity. Storing the new value may replace the previous value (10), which may be discarded or stored as a previous value. For example, if the previous value is stored, a subsequent policy action can restore the previous value by retrieving the previous value from its stored location and storing it as the value of the property, thereby replacing the value 12 with the value 10.

For policies that involve repetition, the policy scheduler 202 may schedule additional events to cause the engine 104 to perform policy actions 210 repeatedly. For each received policy 254, the policy scheduler 202 may determine whether the policy 254 is a repeating policy, e.g., whether the policy 254 specifies any repetition parameters, such as a time period 270 between repetitions or a number of repetitions 272, or repetition criteria 262. If not, the policy scheduler 202 does not schedule repetition-related events. If the policy 254 does specify a repetition parameter or repetition criteria, then the policy scheduler 202 schedules one or more policy events that are to be sent to the policy event dispatcher at a subsequent time. For example, if the policy specifies a repetition time period, a first repetition policy event 208 may be scheduled to be dispatched to an update generator 230 (e.g., with a start time of 0 to indicate no delay), and the repetition policy event 208 may specify that a second repetition policy event is to be scheduled to occur at a time determined based on the time period (e.g., 30 minutes after the first repetition policy event). The policy event dispatcher 206 may schedule the second repetition policy event as part of dispatching the first repetition policy event. The second repetition policy event may occur (e.g., be sent to the policy event dispatcher 206) at its scheduled time (e.g., 30 minutes after the first repetition policy event), responsive to which the update generator 230 may generate updates according to the second policy event.

In particular embodiments, an output generator 234 may receive one or more of the updated values 232 and generate output data 116, which may be sent to a data consumer 118 such as a data logging system or monitoring system.

A plugin 170 can provide a custom simulation policy that can generate actions to be performed responsive to custom policy criteria. The plugin 170 can register a custom simulation policy with the policy scheduler 202. The policy scheduler 202 can store the custom simulation policy in a table of custom simulation policies. For each custom policy, the policy scheduler 202 can identify entities associated with the custom policy and send requests (arrow 207) to the plugin 170 to generate custom policy events to be scheduled for the entities. The plugin 170 can generate one or more custom policy events and send the custom policy events to the policy scheduler 202 (arrow 209). The policy scheduler 202 can schedule the custom policy events by adding the custom policy events to the scheduled policy events 204. The policy event dispatcher 206 can dispatch the custom policy events to the update generator as described above for policy events.

As an example, a plugin may provide a custom policy that generates random values of an entity property at random times. Instances of the custom policy may be associated with entities (e.g., using a policy configuration user interface). The custom policy may have parameters that can be used to specify an entity property to be set to a random value and a range for the random values (e.g., minimum and maximum random values). An example instance of the custom policy specifies that the entity property to be set is "node_mem_used_mb" and the range is 16-256, and a node entity named "Node1" is associated with the example instance of the custom policy. A plugin 170 may register the custom policy with the policy scheduler 202. The policy scheduler 202 may identify each instance of the custom policy, such as the example instance described above, and identify the corresponding entities 158 associated with the instance of the custom policy. For each corresponding entity 158, the policy scheduler 202 may send a request to the registered example custom policy plugin 170 to generate custom policy events. The request may be sent for each corresponding entity for which a request has not previously been sent, for example. The example custom policy plugin 170 may generate a custom policy event having a start time at the random time in the future, and associate the custom policy event with the custom policy (which is associated with the entity property and parameters). The example custom policy plugin 170 may send the custom policy event to the policy scheduler 202, which may schedule the custom policy event to occur (e.g., be sent to the policy event dispatcher 206) at the time specified by the custom policy event (e.g., at the randomly-generated time in the future in this example). The policy scheduler 202 may add the custom policy event 204 to the scheduled policy events 204. Subsequently, responsive to occurrence of the time specified by the custom policy event, the policy event dispatcher 206 may send the custom policy event to the update generator 230 (arrow 211). The update generator 230 may invoke the custom policy plugin 170 associated with the custom policy event as described above with reference to FIG. 1 (e.g., via interactions 172 and 174). The custom policy plugin may generate an updated value 232 by generating a random value (e.g., "90") according to the parameters associated with the custom policy (e.g., in the specified range 16-256) and associate the random value with the entity property having the name specified by the parameters (e.g., "node_mem_used_mb"). The update generator 230 may send the updated value 232, the entity property name, and the entity name ("Node1") to the output generator 234 (arrow 233) and/or to the entity updater 236 (arrow 235). The output generator 234 may generate a metric that includes the updated value (e.g., node_mem_used_mb=90). The entity updater 236 may generate an entity update having the entity name "Node1", the entity property name "node_mem_used_mb", and the property value "90" to the cluster model 120 to set the value of the "node_mem_used_mb" property of the "Node1" node in the cluster model 120 to "90" (arrow 112). The metrics may be sent to a data consumer 118 as output data 116, for example.

Figure 3:
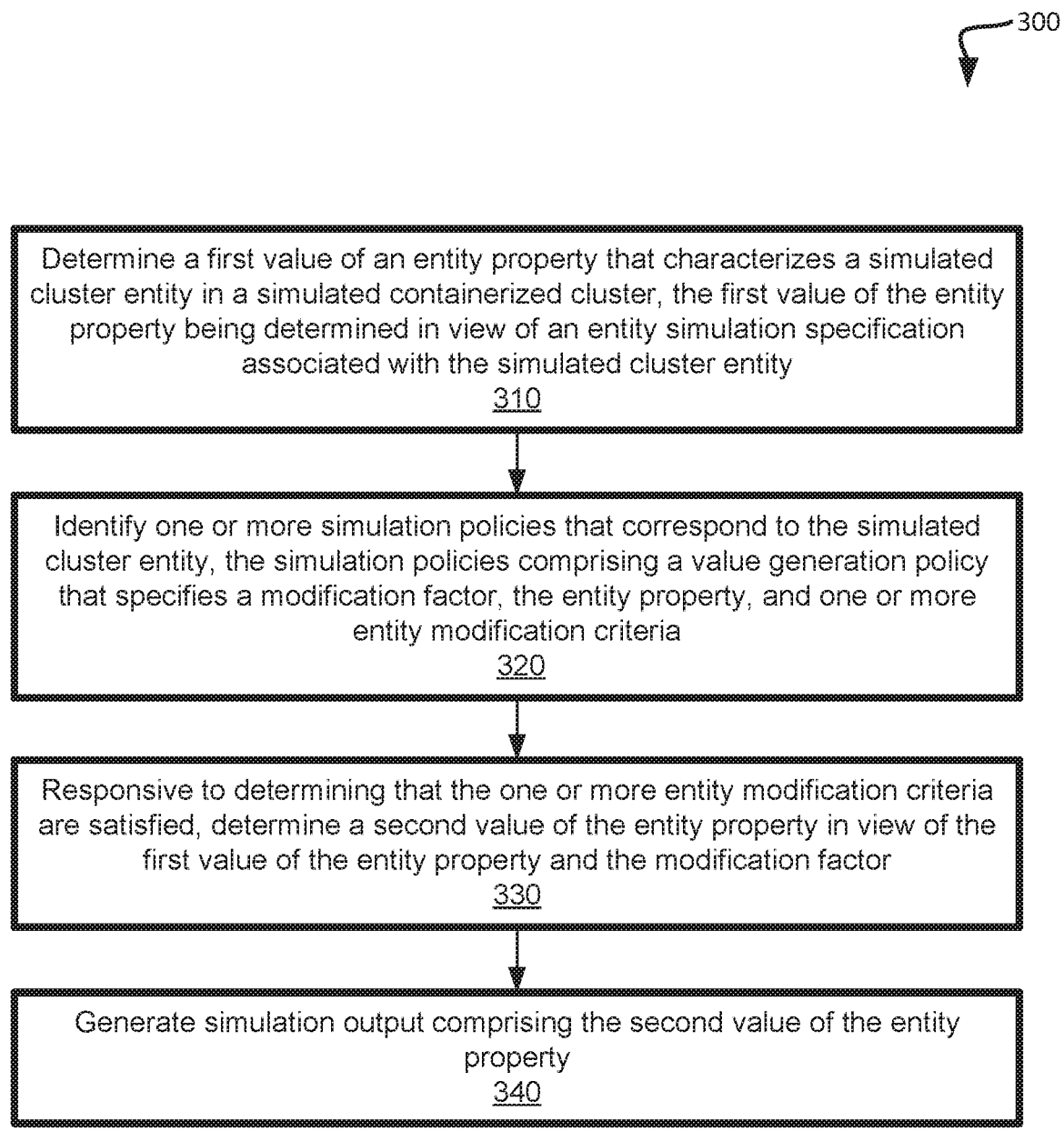
FIG. 3 depicts a flow diagram of an example method for simulating a containerized cluster using simulation policies, in accordance with one or more aspects of the present disclosure.

FIG. 3 depicts a flow diagram of an example method 300 for simulating a containerized cluster using simulation policies, in accordance with one or more aspects of the present disclosure. Method 300 and each of its individual functions, routines, subroutines, or operations may be performed by one or more processors of a computer device executing the method. In certain implementations, method 300 may be performed by a single processing thread. Alternatively, method 300 may be performed by two or more processing threads, each thread executing one or more individual functions, routines, subroutines, or operations of the method. In an illustrative example, the processing threads implementing method 300 may be synchronized (e.g., using semaphores, critical sections, and/or other thread synchronization mechanisms). Alternatively, the processes implementing method 300 may be executed asynchronously with respect to each other.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 300 may be performed by at least a portion of containerized cluster simulator 102, e.g., simulator engine 104, simulation data generator 106, cluster model 120, and API server 140 as shown in FIG. 1 or by an executable code of a host machine (e.g., host operating system or firmware), a virtual machine (e.g., guest operating system or virtual firmware), an external device (e.g., a PCI device), other executable code, or a combination thereof.

Method 300 may be performed by processing devices of a host computer system of containerized cluster simulator 102 and may begin at block 310. At block 310, a host computer system may determine a first value of an entity property that characterizes a simulated cluster entity in a simulated containerized cluster, the first value of the entity property being determined using an entity simulation specification associated with the simulated cluster entity. At block 320, the host computer system may identify one or more simulation policies that correspond to the simulated cluster entity, the simulation policies comprising a value generation policy that specifies a modification factor, the entity property, and one or more entity modification criteria. At block 330, the host computer system may, responsive to determining that the one or more entity modification criteria are satisfied, determine a second value of the entity property using the first value of the entity property and the modification factor. At block 340, the host computer system may generate simulation output comprising the second value of the entity property. The host computer system may send the simulation output to an external system, such as a monitoring system, logging system, a system that tests the containerized cluster, or other suitable consumer.

Figure 4:
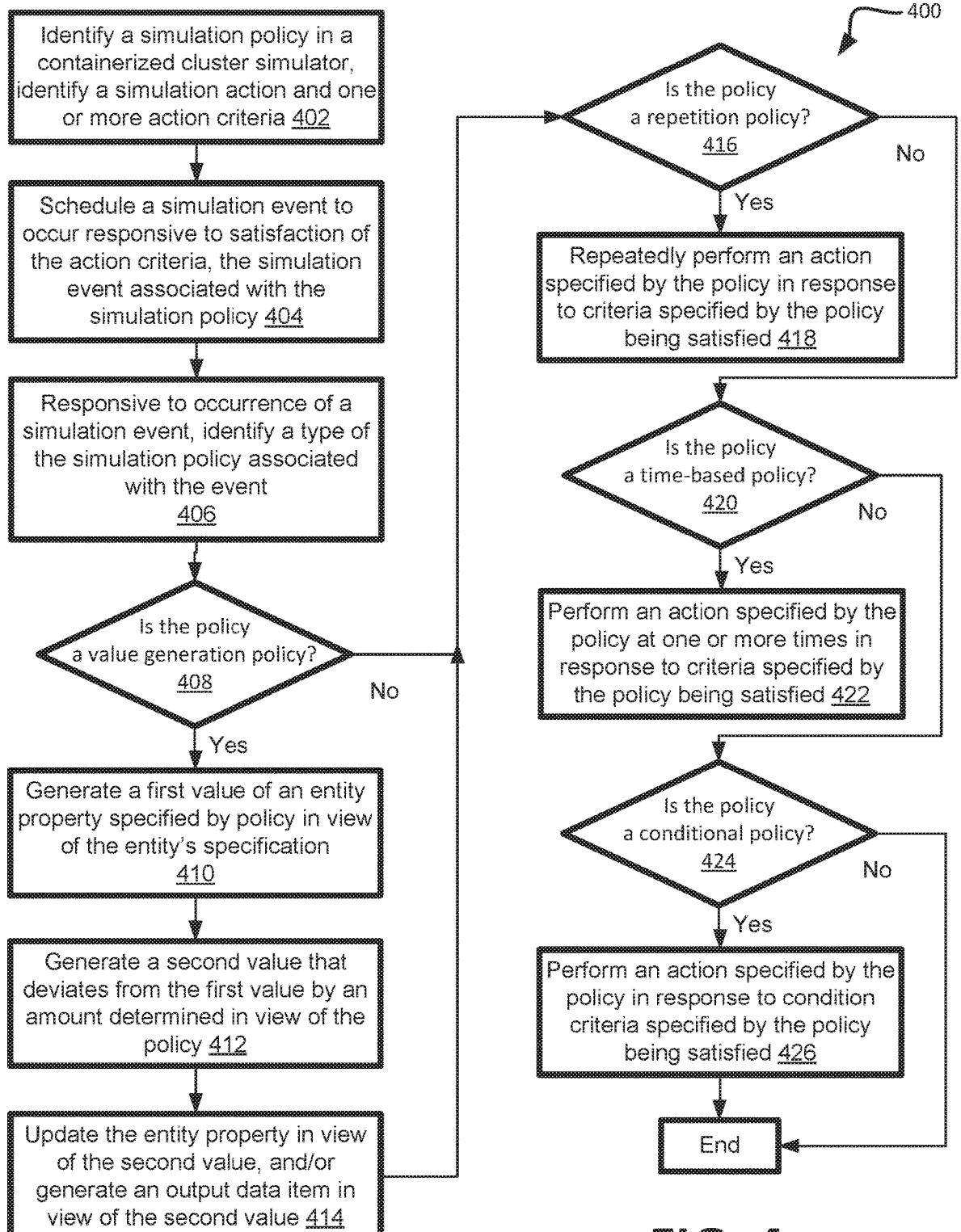
FIG. 4 depicts a flow diagram of an example method for generating simulated entities and output data, in accordance with one or more aspects of the present disclosure.

FIG. 4 depicts a flow diagram of an example method 400 for generating simulated entities and output data, in accordance with one or more aspects of the present disclosure. Method 400 and each of its individual functions, routines, subroutines, or operations may be performed by one or more processors of the computer device executing the method. In certain implementations, method 400 may be performed by a single processing thread. Alternatively, method 400 may be performed by two or more processing threads, each thread executing one or more individual functions, routines, subroutines, or operations of the method. In an illustrative example, the processing threads implementing method 400 may be synchronized (e.g., using semaphores, critical sections, and/or other thread synchronization mechanisms). Alternatively, the processes implementing method 400 may be executed asynchronously with respect to each other.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media. In one implementation, method 400 may be performed by at least a portion of containerized cluster simulator 102, e.g., simulator engine 104, simulation data generator 106, cluster model 120, and API server 140 as shown in FIG. 1 or by an executable code of a host machine (e.g., host operating system or firmware), a virtual machine (e.g., guest operating system or virtual firmware), an external device (e.g., a PCI device), other executable code, or a combination thereof.

Method 400 may be performed by processing devices of a host computer system of containerized cluster simulator 102 and may begin at block 402. At block 402, the host computer system may identify a simulation policy in a containerized cluster simulator, identify a simulation action and one or more action criteria. At block 404, the host computer system may schedule a simulation event to occur responsive to satisfaction of the action criteria, the simulation event associated with the simulation policy. At block 406, the host computer system may, responsive to occurrence of a simulation event, identify a type of the simulation policy associated with the event.

At block 408, the host computer system may determine whether the policy is a value generation policy. This determination of the policy type may be made using a policy action associated with the policy. If the policy is not a value generation policy, the method may continue at block 416. If the policy is a value generation policy, then at block 410, the host computer system may generate a first value of an entity property specified by policy using the entity's specification. At block 412, the host computer system may generate a second value that deviates from the first value by an amount determined using the policy. At block 414, the host computer system may update the entity property using the second value, and/or generate an output data item, such as a metric, using the second value.

At block 416, the host computer system may determine whether the policy is a repetition policy. If not, the method may continue at block 420. If so, then at block 418, the host computer system may perform an action specified by the policy at one or more times.

At block 420, the host computer system may determine whether the policy is a time-based policy. If not, the method may continue at block 424. If so, then at block 422 the host computer may perform an action specified by the policy at one or more times in response to criteria specified by the policy being satisfied.

At block 424, the host computer system may determine whether the policy is a conditional policy. If not, the method may end. If so, then at block 426, the host computer system may perform an action specified by the policy in response to condition criteria specified by the policy being satisfied. Although not shown in FIG. 4, a policy may be one or more of a value generation policy, a repetition policy, a time-based policy or a conditional policy, in which case each of the applicable blocks of the method 400 may be performed for a single policy.

Figure 5:
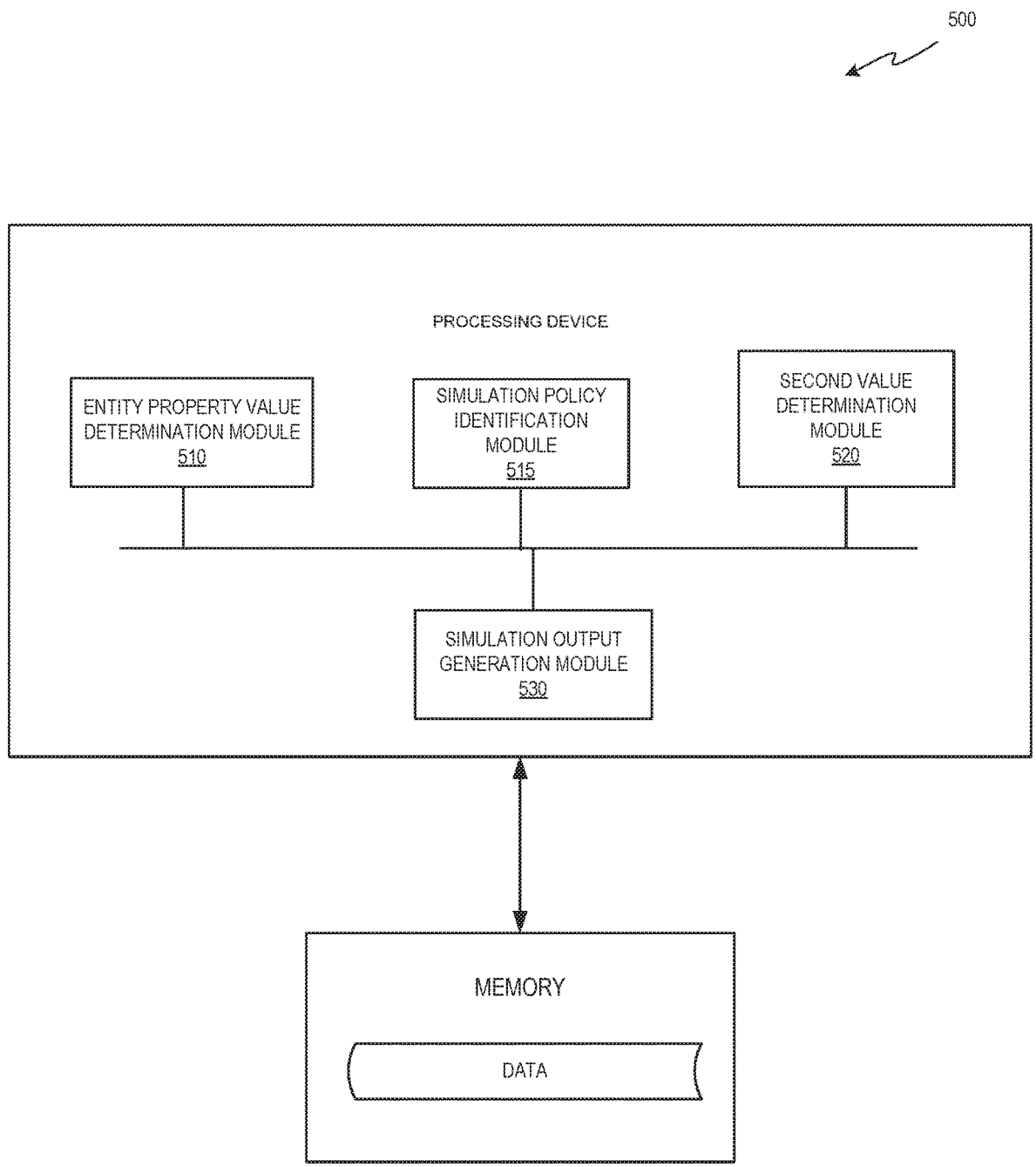
FIG. 5 depicts a block diagram of a computer system operating in accordance with one or more aspects of the present disclosure.

FIG. 5 depicts a block diagram of a computer system 500 operating in accordance with one or more aspects of the present disclosure. Computer system 500 may be the same or similar to host computer systems of the containerized cluster simulator 102 of FIG. 1, and may include one or more processors and one or more memory devices. In the example shown, computer system 500 may include an entity property value determination module 510, a simulation policy identification module 515, a second value determination module 520, and a simulation output generation module 530.

Figure 6:
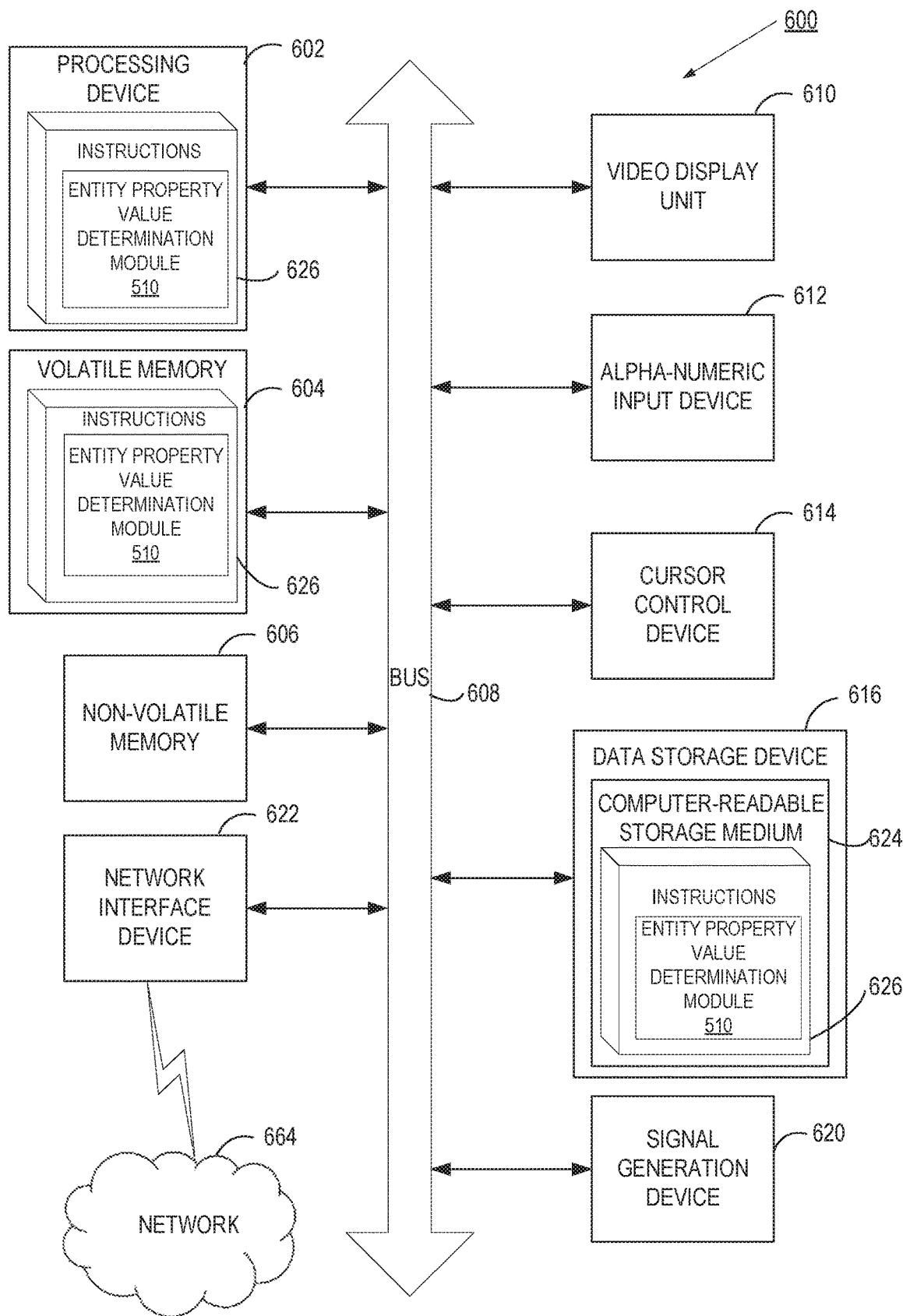
FIG. 6 depicts a block diagram of an example computer system operating in accordance with one or more aspects of the present disclosure.

Entity property value determination module 510 may enable a processor to determine a first value of an entity property that characterizes a simulated cluster entity in a simulated containerized cluster. The first value of the entity property is determined using an entity specification associated with the simulated cluster entity. Simulation policy identification module 515 may enable the processor to identify one or more simulation policies that correspond to the simulated cluster entity. The simulation policies may include a value generation policy that specifies a modification factor, the entity property, and one or more entity modification criteria. Second value determination module 520 may enable the processor to, responsive to determining that the one or more entity modification criteria are satisfied, determine a second value of the entity property using the first value of the entity property and the modification factor. Simulation output generation module 530 may cause the processor to generate simulation output comprising the second value of the at least one simulated entity property FIG. 6 depicts a block diagram of a computer system operating in accordance with one or more aspects of the present disclosure. In various illustrative examples, computer system 600 may correspond to a host computer system of the containerized cluster simulator 102 of FIG. 1, or to a host computer system of the simulator engine 104 and/or cluster model 120 of FIG. 2. The computer system 600 may be included within a data center that supports virtualization. Virtualization within a data center results in a physical system being virtualized using virtual machines to consolidate the data center infrastructure and increase operational efficiencies. A virtual machine (VM) may be a program-based emulation of computer hardware. For example, the VM may operate based on computer architecture and functions of computer hardware resources associated with hard disks or other such memory. The VM may emulate a physical computing environment, but requests for a hard disk or memory may be managed by a virtualization layer of a computing device to translate these requests to the underlying physical computing hardware resources. This type of virtualization results in multiple VMs sharing physical resources.

In certain implementations, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 may include a processing device 602, a volatile memory 604 (e.g., random access memory (RAM)), a non-volatile memory 606 (e.g., read-only memory (ROM) or electrically-erasable programmable ROM (EEPROM)), and a data storage device 616, which may communicate with each other via a bus 608.

Processing device 602 may be provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 600 may further include a network interface device 622. Computer system 600 also may include a video display unit 610 (e.g., an LCD), an alphanumeric input device 612 (e.g., a keyboard), a cursor control device 614 (e.g., a mouse), and a signal generation device 620.

Data storage device 616 may include a non-transitory computer-readable storage medium 624 on which may store instructions 626 encoding any one or more of the methods or functions described herein, including instructions for implementing method 300 or 400 and for encoding components 510, 515, 520, and 530 of FIG. 5.

Instructions 626 may also reside, completely or partially, within volatile memory 604 and/or within processing device 602 during execution thereof by computer system 600, hence, volatile memory 604 and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

Other computer system designs and configurations may also be suitable to implement the system and methods described herein. The following examples illustrate various implementations in accordance with one or more aspects of the present disclosure.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "determining," "deriving," "encrypting," "creating," "generating," "using," "accessing," "executing," "obtaining," "storing," "transmitting," "providing," "establishing," "receiving," "identifying," "initiating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may comprise a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform method 300 or 400 and/or each of its individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method comprising:
   receiving, by a processing device, via a containerized cluster interface, a request to perform an operation on a cluster entity in a non-simulated containerized cluster;
   creating a simulated cluster entity in a simulated containerized cluster, wherein the simulated cluster entity in the simulated containerized cluster represents the cluster entity in the non-simulated containerized cluster;
   determining, in view of an entity specification associated with the simulated cluster entity in the simulated containerized cluster, a first value of an entity property that characterizes the simulated cluster entity;
   identifying a simulation policy that corresponds to the simulated cluster entity, the simulation policy comprising a value generation policy that specifies a modification factor, the entity property, and one or more entity modification criteria;
   responsive to determining that the one or more entity modification criteria are satisfied, determining a second value of the entity property in view of the first value of the entity property and the modification factor;
   generating a simulation output comprising the second value of the entity property to simulate the operation; and
   sending a response to the request, the response including a result of simulating the operation.

2. The method of claim 1, wherein the entity specification comprises a default value or a current value of the entity property, and wherein determining the second value of the entity property comprises multiplying the first value of the entity property by the modification factor.

3. The method of claim 1, wherein the modification factor is specified as a share of the entity property, and wherein determining the second value of the entity property comprises determining an amount that is the specified share of the first value of the entity property and adding the amount to the first value of the entity property.

4. The method of claim 1, wherein the one or more entity modification criteria comprise one or more repetition criteria, wherein determining the second value of the entity property is performed repeatedly, and wherein each repeated occurrence is performed in response to the one or more repetition criteria being satisfied subsequent to a previous occurrence of determining the second value of the entity property,
   wherein the one or more repetition criteria specify a time period, and wherein each repeated occurrence is performed at a time determined in view of the time period.

5. The method of claim 1, wherein the one or more entity modification criteria comprise one or more timing criteria, wherein at least one of the one or more timing criteria comprises a start time criterion, and wherein a first occurrence of determining the second value of the entity property is performed in response to determining that a current time satisfies the start time criterion.

6. The method of claim 5, wherein the start time criterion is relative to an occurrence of an event associated with the corresponding cluster entity, and wherein the event comprises a creation of the corresponding cluster entity.

7. The method of claim 5, wherein the one or more timing criteria specify a time period, and wherein determining that one or more entity modification criteria are satisfied comprises:
waiting, by the computing device, for the time period to elapse.

8. The method of claim 1, wherein the one or more entity modification criteria comprise a threshold condition specified in view of a designated cluster entity property that characterizes a designated cluster entity, and wherein determining the second value of the entity property is performed in response to the threshold condition being satisfied by a value of the designated entity property.

9. The method of claim 1, wherein the simulation policy further comprises a repeating policy that specifies one or more repetition criteria and further specifies a designated simulation policy specifying an action, the method further comprising:
performing, by the computing device, the action repeatedly, wherein each repeated performance is in response to the repetition criteria being satisfied subsequent to a previous performance of the action.

10. The method of claim 9, wherein the action corresponds to one or more of:
generating an entity value,
performing a second action specified by the designated simulation policy repeatedly in view of other repetition criteria specified by the designated simulation policy,
performing the second action specified by the designated simulation policy at one or more times in response to satisfaction of timing criteria specified by the designated simulation policy, or
performing the second action specified by the designated simulation policy responsive to satisfaction of a condition specified by the designated simulation policy.

11. The method of claim 1, wherein the simulation policy further comprises a time-based policy that specifies one or more timing criteria, and the time-based policy specifies a designated simulation policy specifying an action, the method comprising:
performing, by the computing device, the action at one or more times responsive to satisfaction of the timing criteria.

12. The method of claim 1, wherein the simulation policy further comprises a conditional policy that specifies a condition and further specifies a designated simulation policy specifying an action, the method comprising:
performing, by the computing device, the action in response to the condition being satisfied.

13. The method of claim 1, wherein the simulated cluster entity comprises a container entity or a node entity generated in response to a workload request received from an external system.

14. The method of claim 1, wherein the simulation output comprises a simulation metric, and wherein simulation metric identifies the entity property and comprises the second value of the entity property.

15. The method of claim 1, wherein the simulated cluster entity represents a cluster resource, and wherein the entity property that characterizes the simulated cluster entity comprises one of: an amount of the resource that is in use, an amount of the resource that is available, or a time-related performance characteristic of the resource.

16. The method of claim 1, further comprising:
sending, by the computing device, the simulation output to an external system, wherein the simulation output further comprises an identification of the entity property.

17. The method of claim 1, wherein determining the second value of the entity property comprises:
providing the first value of the entity property and an identifier that identifies the entity property to a plugin associated with the simulated cluster entity, wherein the plugin determines the second value of the entity property; and
receiving the second value of the entity property from the plugin.

18. The method of claim 17, wherein the plugin sends a plugin output determined in view of the second value of the entity property and further in view of an identification of the entity property to an external system.

19. A system comprising:
a memory; and
a processing device communicably coupled to the memory, the processing device to:
receive, via a containerized cluster interface, a request to perform an operation on a cluster entity in a non-simulated containerized cluster;
create a simulated cluster entity in a simulated containerized cluster, wherein the simulated cluster entity in the simulated containerized cluster represents the cluster entity in the non-simulated containerized cluster;
determine, in view of an entity specification associated with the simulated cluster entity in the simulated containerized cluster, a first value of an entity property that characterizes the simulated cluster entity;
identify a simulation policy that corresponds to the simulated cluster entity, the simulation policy comprising a value generation policy that specifies a modification factor, the entity property, and one or more entity modification criteria;
responsive to determining that the one or more entity modification criteria are satisfied, determine a second value of the entity property in view of the first value of the entity property and the modification factor;
generate a simulation output comprising the second value of the entity property to simulate the operation; and
send a response to the request, the response including a result of simulating the operation.

20. A non-transitory machine-readable storage medium storing instructions which, when executed, cause a processor to perform operations comprising:
receiving, via a containerized cluster interface, a request to perform an operation on a cluster entity in a non-simulated containerized cluster;
creating a simulated cluster entity in a simulated containerized cluster, wherein the simulated cluster entity in the simulated containerized cluster represents the cluster entity in the non-simulated containerized cluster;

determining, in view of an entity specification associated with the simulated cluster entity in the simulated containerized cluster, a first value of an entity property that characterizes the simulated cluster entity;

identifying a simulation policy that corresponds to the simulated cluster entity, the simulation policy comprising a value generation policy that specifies a modification factor, the entity property, and one or more entity modification criteria;

responsive to determining that the one or more entity modification criteria are satisfied, determining a second value of the entity property in view of the first value of the entity property and the modification factor;

generating a simulation output comprising the second value of the entity property to simulate the operation; and sending a response to the request, the response including a result of simulating the operation.

* * * * *